Feb. 13, 1962 D. L. MILAM 3,021,460
SEMICONDUCTOR TRANSLATING DEVICE WITH
SILICONE FLUID FILLER
Filed Aug. 20, 1957
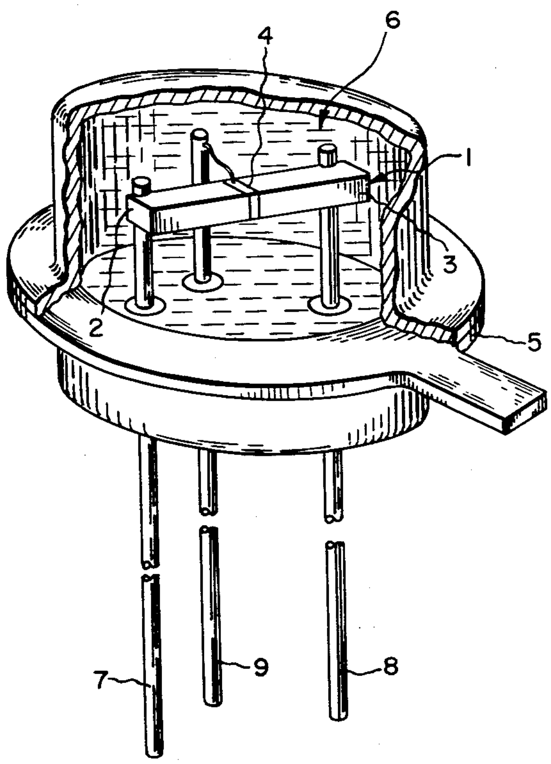
INVENTOR
DAVID L. MILAM
BY Stevens, Davis, Miller & Mosher
ATTORNEYS United States Patent Office 3,021,460

Patented Feb. 13, 1962

3,021,460

SEMICONDUCTOR TRANSLATING DEVICE WITH SILICONE FLUID FILLER

David L. Milam, Dallas, Tex., assignor to Texas Instruments Incorporated, Dallas, Tex., a corporation of Delaware Filed Aug. 20, 1957, Ser. No. 679,178

5 Claims. (Cl. 317—234)

The present invention relates to semiconductor devices, and more particularly to semiconductor devices which are encapsulated within a quantity of filler compound.

Certain semiconductor materials, such as germanium and silicon, may exist in either of two conductivity types, depending upon the treatment of the material and the presence of extremely small amounts of certain impurities. N-type material is characterized by an excess of electrons and its conductivity is due to the presence of these electrons. P-type material is characterized by a deficiency of electrons in the crystal structure of the material, resulting in so-called holes, and the conductivity of the material is due to an apparent movement of these holes, which act like positive charges. If a body of semiconductor material has adjoined zones of n-type and p-type material, the junction between the two zones acts as a rectifying barrier or layer since it permits current to flow freely from the p-type material to the n-type material, but presents a very high resistance to current flow in the reverse direction, so that only an extremely small leakage current can flow.

In point contact semiconductors, one or more elements are held against a semiconductor element and supported to prevent shifting from an initial position. In barrier or junction type transistors, a thin layer or zone of semiconductor material of one type of conductivity is sandwiched between two zones of semiconductor material of the opposite type conductivity. Electrical connections are then made to each of the three zones.

It is often desirable to hermetically seal or encapsulate such barrier layer and point contact devices within a suitable filler compound in order to protect them from moisture and other environmental factors which have adverse effects on the characteristics of the device. A satisfactory fabrication of such devices requires encasing the device in a quantity of a material, or a combination of materials which in addition to protecting the unit against moisture must also meet other severe requirements. For instance, the completed unit must be able to withstand either continuous or intermittent operation at elevated temperatures. The unit must also be capable of withstanding temperature cycling over a broad temperature range, without structural damage and without damage to the fragile semiconductor device because of differences in thermal expansion, or other causes. The structure must also possess the capacity to withstand manufacturing operations, such as soldering to be performed at high temperatures, without damage to the semiconductor device, and it must be such that the semiconductor is adequately protected against mechanical stresses or shocks. The encapsulating compound must provide effective electrical insulation for the unit and provide a suitable construction for mechanical protection, as well as providing good heat transfer from the semiconductor, since such devices have rather definite temperature limits and effective dissipation of heat is necessary to realize high power ratings. It will be evident, therefore, that the problem of properly encapsulating semiconductor devices involves numerous difficulties.

Accordingly, therefore, a primary object of the present invention is to provide an encapsulated semiconductor device which is capable of high temperature operation over a wide temperature range, without either damage to the device or deterioration of its characteristics, and with good heat dissipation to permit high power rating.

Another object of the present invention is to disclose a novel encapsulating compound characterized by superior thermal conductivity.

A further object of this invention is to teach a filler compound for semiconductor devices which provides superior shock resistance.

These and other objects and advantages of the invention will become clear by referring to the following detailed description and the drawing in which the drawing shows diagrammatically a plural element semiconductor device encapsulated within a supply of filler compound.

More particularly, the drawing indicates diagrammatically an encapsulated transistor comprised of a semiconductor bar 1 provided with an emitter zone 2, a collector zone 3, and a middle or base zone 4. It will be appreciated that the semiconductor devices in which this invention has application may comprise either a conventional barrier layer type as shown or point contact type semiconductor device.

A suitable casing 5 is disposed to completely surround the transistor assembly. The emitter, collector and base electrodes 7, 8 and 9 are, of course, made available externally of the casing.

Within the casing 5, there is provided a supply of filler compound, as indicated by the reference numeral 6. The specific ingredients used in the compound 6, as well as the proportions thereof, combine to yield a substance characterized by superior heat conductivity and thermal conductance and good electrical insulation properties.

The base ingredient of this novel filler compound is the material commercially identified as Dow-Corning "D–C–200" Silicone Fluid. The Dow Corning "D–C 200" Silicone Fluid is fully disclosed in a booklet entitled Dow Corning Silicone Notebook, Reference No. 2003, Dow Corning 200 Fluids, Copyright 1948 and 1952 by Dow Corning Corporation, published in Canada under the Berne Convention. As disclosed in this publication, the Dow Corning 200 Fluids are dimethyl polysiloxanes in which dimethyl siloxane units are linked together to form chains of varying length represented by the formula:

$$CH_3-\overset{CH_3}{\underset{CH_3}{Si}}-\left[O-\overset{CH_3}{\underset{CH_3}{Si}}-\right]_n O-\overset{CH_3}{\underset{CH_3}{Si}}-CH_3$$

The fluids made up of these chains remain fluid at room temperature even though $n$ may range from 0 to 2000 or more. The viscosity of the fluid is determined by the average length of the chain. The additional ingredient providing superior thermal properties comprises an oxide of either titanium or aluminum, in the proportions 40% to 80% by weight.

In practising the invention, it has been found that the use in transistors of such a filler comprising from 65% to 80% by weight of powdered titanium dioxide ($TiO_2$) or aluminum trioxide ($Al_2O_3$) in DC Silicone Fluid has provided outstandingly rapid thermal dissipation.

Although best results have been obtained with a 1000 centistoke electrical grade silicone fluid, satisfactory results may be obtained with many other types and grades of silicone fluids.

In addition, the capacity of the transistor unit to withstand mechanical shock, rigorous temperature cycling, and the elevated temperatures associated with soldering has been sharply superior to that obtainable with prior art encapsulating compounds.

While I have, therefore, disclosed my invention in such full, clear and concise terms as will enable those skilled in the art to practice and understand it, it will be readily obvious that various modifications, substitutions and alternations may be made therein without departing from the spirit and scope of the appended claims.

What I claim is:

1. In combination with an encapsulated semiconductor translating device, a filler composition consisting essentially of the mixture of silicone fluid with 40% to 80% by weight of a metal oxide from the group consisting of $TiO_2$ and $Al_2O_3$, said silicone fluid being of the type represented by the formula:

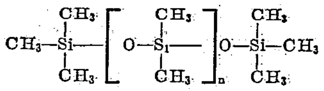

where $n$ is an integer from 0 to 2000.

2. In combination with an encapsulated semiconductor translating device, a filler composition consisting essentially of a mixture of silicone fluid of the type represented by the formula:

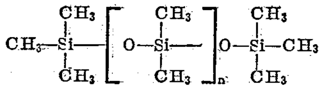

where $n$ is an integer from 0 to 2000 and at least 40% titanium dioxide by weight.

3. In combination with an encapsulated semiconductor translating device, a filler composition consisting essentially of a mixture of 1000 centistoke electrical grade silicone fluid of the type represented by the formula:

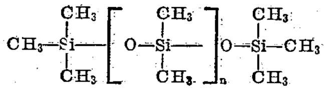

where $n$ is an integer from 0 to 2000 and between 65% and 80% titanium dioxide by weight.

4. In combination with an encapsulated semiconductor translating device, a filler composition consisting essentially of a mixture of silicone fluid of the type represented by the formula:

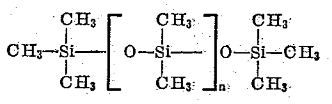

where $n$ is an integer from 0 to 2000 and at least 40% aluminum trioxide by weight.

5. In combination with an encapsulated semiconductor translating device, a filler composition consisting essentially of a mixture of 1000 centistoke electrical grade silicone fluid of the type represented by the formula:

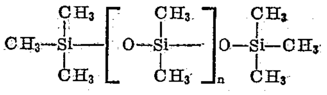

where $n$ is an integer from 0 to 2000 and between 65% and 80% aluminum trioxide by weight.

References Cited in the file of this patent

UNITED STATES PATENTS

| | | |
|---|---|---|
| 2,515,672 | Sowa | July 18, 1950 |
| 2,671,069 | Savage | Mar. 2, 1954 |
| 2,677,658 | Bidaud | May 4, 1954 |
| 2,737,506 | Hurd et al. | Mar. 6, 1956 |
| 2,752,541 | Losco | June 26, 1956 |
| 2,802,017 | Frost et al. | Aug. 6, 1957 |
| 2,833,742 | Koch | May 6, 1958 |
| 2,857,560 | Schnable et al. | Oct. 21, 1958 |
| 2,875,098 | Blatz | Feb. 24, 1959 |